United States Patent
Sridhara et al.

(10) Patent No.: US 9,362,954 B1
(45) Date of Patent: Jun. 7, 2016

(54) DIGITAL COMMUNICATIONS CHANNEL

(71) Applicant: Seagate Technology LLC, Cupertino, CA (US)

(72) Inventors: Deepak Sridhara, Boulder, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 85 days.

(21) Appl. No.: 14/026,423

(22) Filed: Sep. 13, 2013

Related U.S. Application Data

(60) Provisional application No. 61/788,640, filed on Mar. 15, 2013.

(51) Int. Cl.
*G06F 11/00* (2006.01)
*H04R 3/00* (2006.01)
*H03M 13/27* (2006.01)

(52) U.S. Cl.
CPC .................................. *H03M 13/27* (2013.01)

(58) Field of Classification Search
CPC ........... G01R 31/31725; H03K 19/003; H03K 3/0375; H03K 3/012; H03M 13/2957; H03M 13/1102; H03M 13/152; H03M 13/23; H03M 13/3707; H03M 13/41; H03M 13/611; H03M 13/1137; H03M 13/6566; G06F 11/10; H04L 1/0057; H04L 1/007; H04L 1/0071
USPC ................. 714/782, 758, 795, 799, 781, 784, 714/E11.032, 800, 755, 786, 752, 751, 746, 714/774; 375/341
See application file for complete search history.

(56) References Cited

U.S. PATENT DOCUMENTS

| | | | | |
|---|---|---|---|---|
| 5,844,945 A * | 12/1998 | Nam et al. | | 375/341 |
| 5,983,383 A * | 11/1999 | Wolf | | 714/755 |
| 7,237,173 B2 * | 6/2007 | Morita | | G11B 20/10009 375/341 |
| 8,245,104 B2 * | 8/2012 | Yang et al. | | 714/758 |
| 8,347,195 B1 * | 1/2013 | Varnica et al. | | 714/785 |
| 8,468,418 B2 * | 6/2013 | Yang et al. | | 714/758 |
| 8,532,586 B2 * | 9/2013 | Lakkis et al. | | 455/91 |
| 8,612,843 B2 * | 12/2013 | Jin | | G06F 11/0751 714/723 |
| 8,656,244 B1 * | 2/2014 | Chang | | 714/752 |
| 8,744,389 B2 * | 6/2014 | Lakkis et al. | | 455/190.1 |
| 8,812,939 B2 * | 8/2014 | Yang et al. | | 714/782 |
| 2006/0265634 A1 * | 11/2006 | Silvus et al. | | 714/784 |
| 2009/0199073 A1 * | 8/2009 | Kanaoka et al. | | 714/758 |
| 2010/0146363 A1 * | 6/2010 | Birru | | H04L 1/0043 714/752 |
| 2012/0198314 A1 * | 8/2012 | Yang et al. | | 714/782 |
| 2013/0343495 A1 * | 12/2013 | Han et al. | | 375/341 |
| 2014/0032992 A1 * | 1/2014 | Hara et al. | | 714/773 |

OTHER PUBLICATIONS

Richardson et al., Efficient Encoding of Low-Density Parity-Check Codes, IEEE Transactions on Information Theory, Feb. 2001, pp. 638-656, vol. 47, No. 2.

(Continued)

*Primary Examiner* — Phung M Chung
(74) *Attorney, Agent, or Firm* — Cesari & Reed, LLP; Kirk A. Cesari

(57) ABSTRACT

Encoding and decoding schemes are presented with various configurations for error correcting code (ECC) encoders and decoders. Bits from encoders can be interleaved before they are transmitted to the communications medium. During receiving, or read back, stronger, converged ECC decoders can help with weaker decoders through detector iterations. Variations of iterative detector-decoders are described.

19 Claims, 14 Drawing Sheets

(56) References Cited

OTHER PUBLICATIONS

Chung et al., On the Design of Low-Density Parity-Check Codeswithin 0.0045 dB of the Shannon Limit, IEEE Communications Letters, Feb. 2001,58-60, vol. 5, No. 2.

Guruswami, Iterative Decoding of Low-Density Parity Check Codes, Department of Computer Science and Engineering, Sep. 2006, University of Washington Seattle, WA 98195.

Siegel, An Introduction to Low-Density Parity-Check Codes, May 2007, Electrical and Computer Engineering University of California, San Diego. http://cmrr-star.ucsd.edu/psiegel/pubs/07/ldpc_tutorial.ppt.

MacKay, Good Error-Correcting Codes Based on Very Sparse Matrices, IEEE Transactions on Information Theory, Mar. 1999, pp. 399-431, vol. 45, No. 2.

Tanner, A Recursive Approach to Low Complexity Codes, IEEE Transactions on Information Theory, Sep. 1981, pp. 533-547, vol. IT-27, No. 5.

Gallager, Low-Density Parity-Check Codes, 1963, pp. 1-90.

Leiner, LDPC Codes—a brief Tutorial, Apr. 8, 2005 http://www2.engr.arizona.edu/~ece506/readings/project-reading/5-ldpc/LDPC_Intro.pdf.

Richardson, Design of Capacity-Approaching Irregular Low-Density Parity-Check Codes, IEEE Transactions on Information Theory, Feb. 2001, pp. 619-637, vol. 47, No. 2.

Richardson, The Capacity of Low-Density Parity-Check Codes Under Message-Passing Decoding, IEEE Transactions on Information Theory, Feb. 2001, pp. 599-618, vol. 47, No. 2.

Richardson, Multi-Edge Type LDPC Codes, presented at the Workshop honoring Prof. Bob McEliece on his 60th birthday,May 24-25, 2002. California Institute of Technology, Pasadena, California.

Chung, On the Construction of Some Capacity-Approaching Coding Schemes, Ph.D. dissertation, Sep. 2000, Massachusetts Institute of Technology, Cambridge, Massachusetts.

Hu, Progressive Edge-Growth Tanner Graphs, IBM Research, 2001, Zurich Research Laboratory, 8803, Ruschlikon, Switzerland.

MacKay, Near Shannon Limit Performance of Low Density Parity Check Codes, Cavendish Laboratory, 1996, 4 pages, Cambridge, United Kindom.

Tanner, On Quasi-Cyclic Repeat-Accumulate Codes,Department of Computer Science University of California, 10 Pages, Sep. 1999, Santa Cruz, CA.

Low Density Parity Check Codes, papers, 1 page. www.ldpc-codes.com/papers.html.

* cited by examiner

Stage 1 of a serial decoder architecture

Stage 2 of a serial decoder architecture

Stage N of a serial decoder architecture

Stage 1 of a parallel-serial decoder architecture

Stage 2 of a parallel-serial decoder architecture

Stage N of a parallel-serial decoder architecture

Stage 1 of a parallel-serial decoder architecture

Stage 2 of a parallel-serial decoder architecture

Stage N of a parallel-serial decoder architecture

DIGITAL COMMUNICATIONS CHANNEL

CROSS REFERENCE TO RELATED APPLICATIONS

The present application claims priority to U.S. provisional patent application Ser. No. 61/788,640, filed on Mar. 15, 2013, entitled "Bit-Interleaved Coding in Intersymbol-Interference Channels", the contents of which is hereby incorporated by reference in its entirety.

SUMMARY

The present disclosure provides systems and methods of a digital communications channel. In certain embodiments, an apparatus can comprise a communications circuit including a memory and a decoding circuit having multiple error-correcting code (ECC) decoders. The multiple ECC decoders may be configured to provide information from an iteration of at least one of the multiple ECC decoders to another iteration of at least one of the multiple ECC decoders.

In other embodiments, an apparatus can comprise a digital communications receiver including a detector configured to estimate bits of a signal received from a channel and a decoding circuit including multiple error correcting code (ECC) decoders. The multiple ECC decoders may be configured to provide information from the decoding circuit to the detector, the decoder configured to process the signal by iterating between the detector and the decoding circuit to decode the received codewords.

In yet other embodiments, an apparatus can comprise a digital signal decoding circuit including a first decoder with a first code strength to estimate a first bit of a digital signal and a second decoder with a second code strength weaker than the first code strength. The first decoder can be configured to provide information to improve an estimate of a second bit from the second decoder.

DETAILED DESCRIPTION

The present disclosure is generally related to communications channel encoding and decoding, more specifically to digital communications channels and data channels having memory.

While this description discusses disc-based storage media as example communication channels, the systems and methods detailed herein can be applied to any communications channel with a memory.

Figure 1:
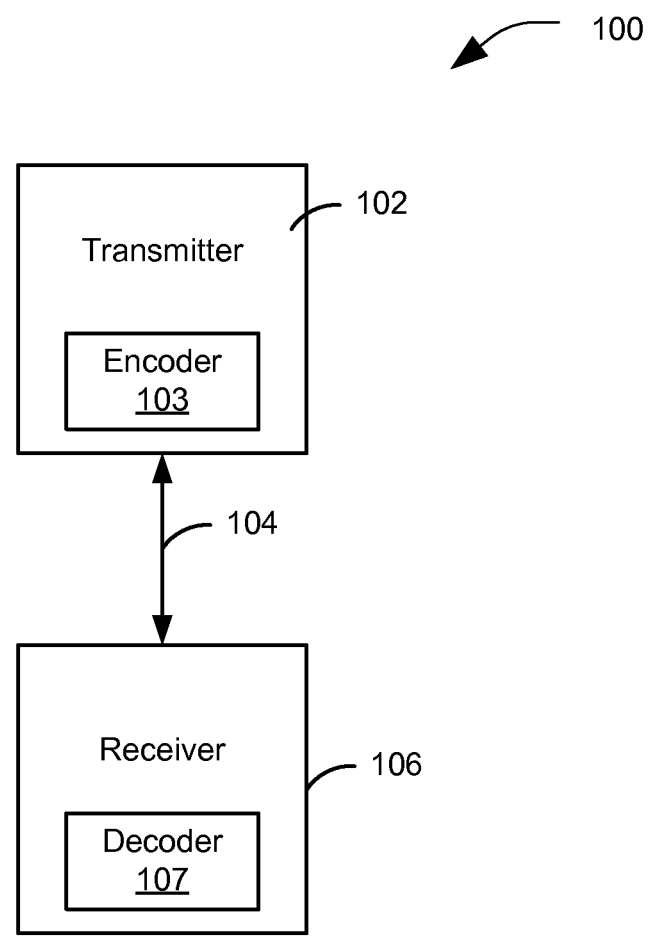
FIG. 1 is a diagram of a communications system with a digital communications channel, in accordance with certain embodiments of the present disclosure.

Referring to FIG. 1, a diagram of a communications system a digital communications channel is shown and generally designated 100. The communications system may include a transmitter 102 with an encoder 103, a transmission medium 104, and a receiver 106 with a decoder 107. The transmitter 102 and the receiver 106 may in a same device or may be in separate devices. Further, the transmission medium 104 may be any type of transmission medium, such as a signal transmission or a data storage medium (not shown).

The encoder 103 and the decoder 107 may be implemented using various schemes with error correcting code (ECC). As such, encoder 103 may include one or more encoders and decoder 107 may include one or more decoders. Bits from the encoder(s) 103 can be interleaved before they are transmitted to a communications medium. During receiving, or read back, the decoder(s) 107 can have stronger, converged ECC decoders that can help with weaker decoders through detector/decoder iterations. Further, the encoders and decoders may have different code rates.

The encoding and decoding schemes disclosed herein can use multiple ECC encoders and decoders with varying code rates. Bits, or collection of bits, from each codeword can be interleaved (i.e. permuted) before they are transmitted (in some cases, transmission may include writing to one or more data storage medium). In some of the example schemes, information can be exchanged between a soft-decision detector that estimates bits according to a memory in the channel and multiple soft-decision decoders for the different ECC codes that estimate the bits according to the constraints imposed within each ECC code.

Different variations of the iterative detector-decoder schedule are disclosed herein. In general, stronger ECC will converge first and will help weaker ECC codes through iteration with a detector with memory. By optimizing the strengths of each ECC code in such schemes, performance and reliability can be improved.

In some examples, the transmitter 102 may be a write channel of a data storage device (DSD), the transmission medium 104 may be a data storage medium of the DSD, and the receiver 106 may be a read channel of the DSD. For example, the channel in a disc drive or other DSD can be a channel with memory. While the scheme disclosed herein are applicable to any communication system or communication channel with memory, the discussion will focus mainly on a write and read channel for a DSD, such as a hard disc drive.

Figure 2:
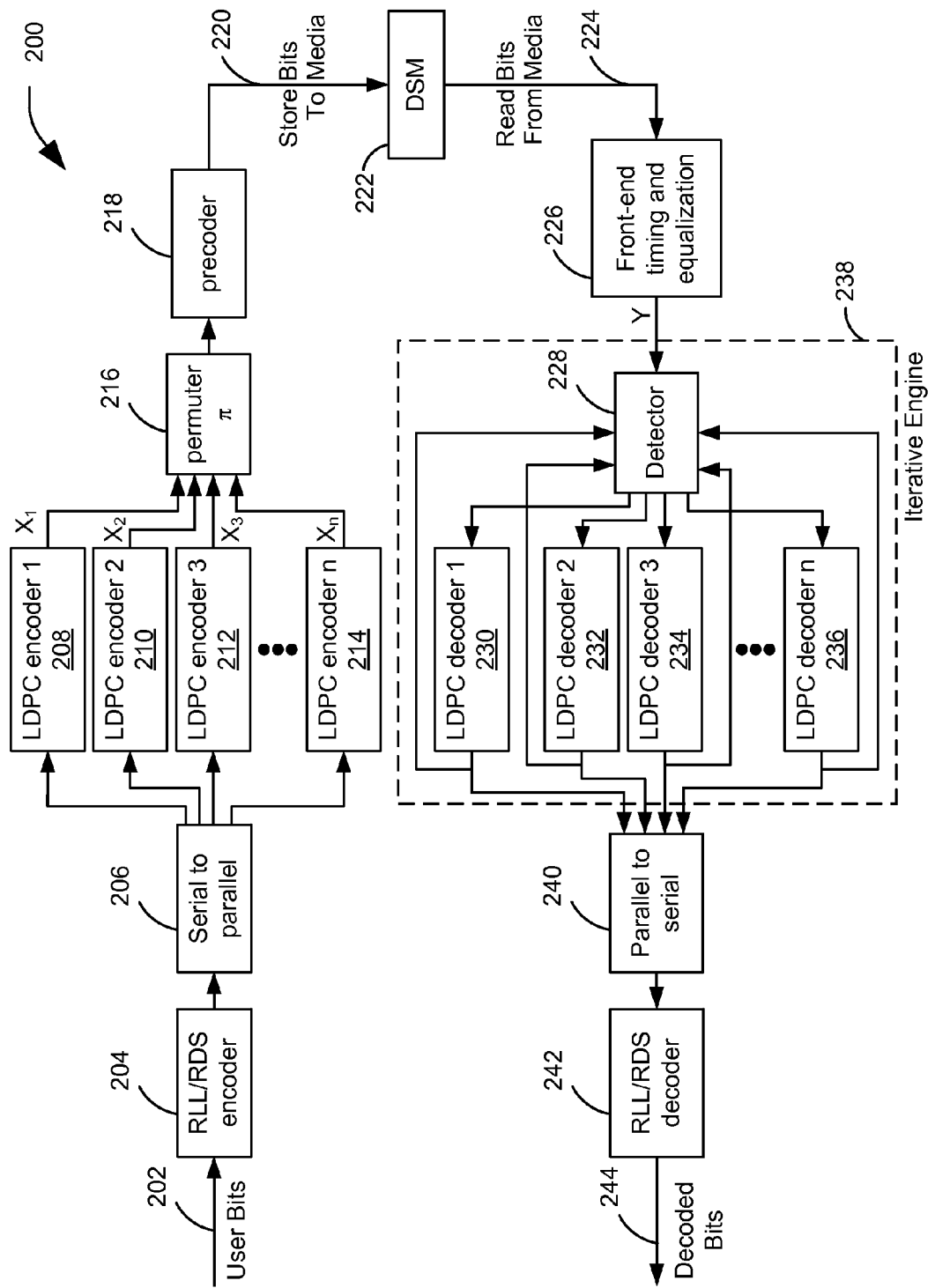
FIG. 2 is a diagram of a digital communications channel, in accordance with certain embodiments of the present disclosure.

Referring to FIG. 2, a diagram of a digital communications channel is shown and generally designated 200. The communications channel may include a transmission channel, for example, including encoder 204, serial-to-parallel converter 206, encoders 208 through 214 (as applicable), permuter 216, and precoder 218. The communications channel may also include a transmission medium, such as transmission 220, data storage medium (DSM) 222, and reception 224. The communications channel may also include a reception channel, for example, including front-end timing and equalization circuit 226, detector 228, decoders 230 through 236 (as applicable), parallel-to-serial converter 240, and decoder 204.

Figure 3:
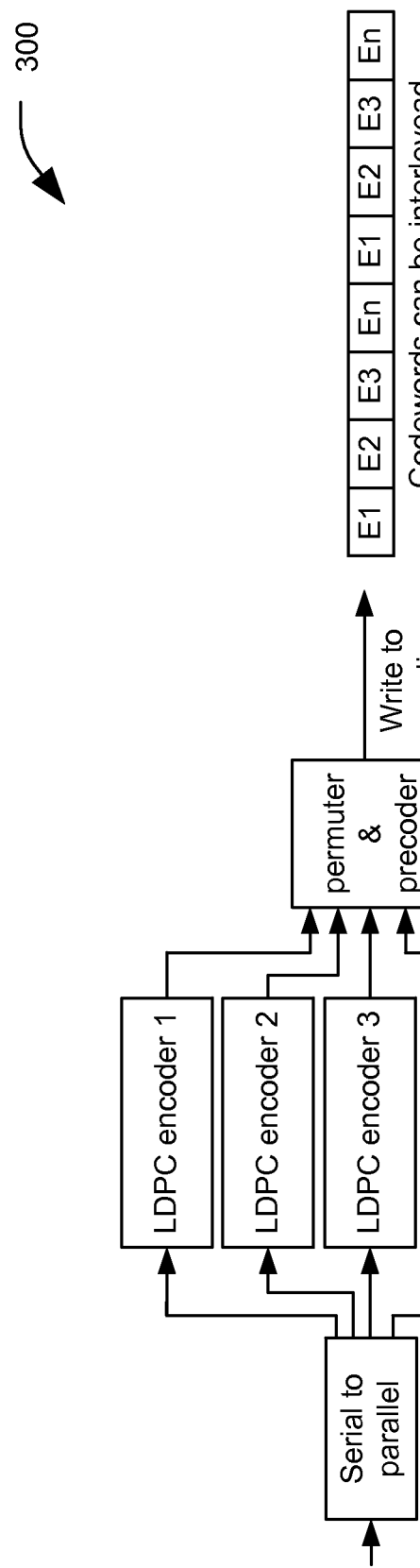
FIG. 3 is a diagram of an encoder, in accordance with certain embodiments of the present disclosure.

During transmission or writing, user bits can be first encoded by a constrained code such as a run-length-limited (RLL) or a running-digital-sum (RDS) code at the encoder 204. The encoded bits from the RLL/RDS encoder 204 may be passed through the serial-to-parallel converter 206 and then the bits can be encoded by a systematic ECC code such as an low density parity check code (LDPC) via LDPC encoders 208, 210, and 212 through 214 as applicable. The parallel streams outputs from the serial-to-parallel converter 206 can each be encoded by a separate LDPC encoder. The output (codewords) from the LDPC encoders 208-214 can then be permuted (such as interleaving) at permuter 216 and sent through precoder 218 before the bits 220 are transmitted (or written onto the media). In the depicted example, the bits 220 can be transmitted to a DSM 222, such as a magnetic disk. FIG. 3, as further described below, shows an example of how codewords generated by the LDPC encoders 208-214 can be interleaved together by a permuter and subsequently sent through a precoder.

During reading, a signal 224 can be received, such as from a read head of magnetic disc, and is processed through a front-end block circuit 226 (may include a pre-amplifier, low-pass filters, analog-to-digital converter, a timing recovery circuitry, and an equalizer) to provide a processed signal. The processed signal can then be sent through the equalizer that equalizes the processed signal to a target finite memory channel response.

The equalized signal can then be sent through a soft-decision detector 228 that estimates the bits of the signal (for example, written onto the media) and also produces soft-reliability estimates for the bits, sometimes referred to as soft-information. The soft-information can then be sent to LDPC decoders 230, 232, 234, 236, that process this information for one or more local iterations and produces new ("extrinsic") soft-information that is sent back to the detector as apriori information. The detector re-estimates the bits and generates new (for example, "extrinsic") information to the LDPC decoder 232 and this process continues iteratively until the LDPC decoders 230-236 converge to a "codeword" or a maximum number of iterations have been reached. The detector 228 and the LDPC decoders 230-236 may be referred to as an iterative engine 238.

The output bits estimated from the iterative engine 238 can be provided to the parallel-to-serial converter 240 and the serial output can then be decoded by the RLL/RDS decoder 242 to generate the decoded bits 244, which may then be provided to a processor or host.

By having multiple LDPC encoders, the systems described herein provide flexibility in choosing the strengths of the different LDPC codes appropriately so as to maximize the performance and reliability of a system. The encoded bits from the different LDPC encoders can be interleaved so that during the iterative detection and decoding process, the estimates received from one LDPC decoder can help improve the estimates of the other bits during detection. A channel memory can correlate the read-back signal across consecutively written bits. Thus, during detection of a current bit, any apriori knowledge of adjacent bits that are obtained from corresponding ECC decoders for those bits will help improve the estimate of the current bit.

Referring to FIG. 3, a diagram of an encoder is shown and generally designated 300. The encoder 300 illustrates how bits from multiple codewords can be interleaved by a permuter for transmission, such as to be stored to a DSM. In the example depicted, there are four different LDPC encoders; however, any number of LDPC encoders or different ECC encoders can be used.

There are several decoding options for the architectures described above. Below is a description of different decoder architectures and example rules for selecting the codes for each architecture.

Figure 4:
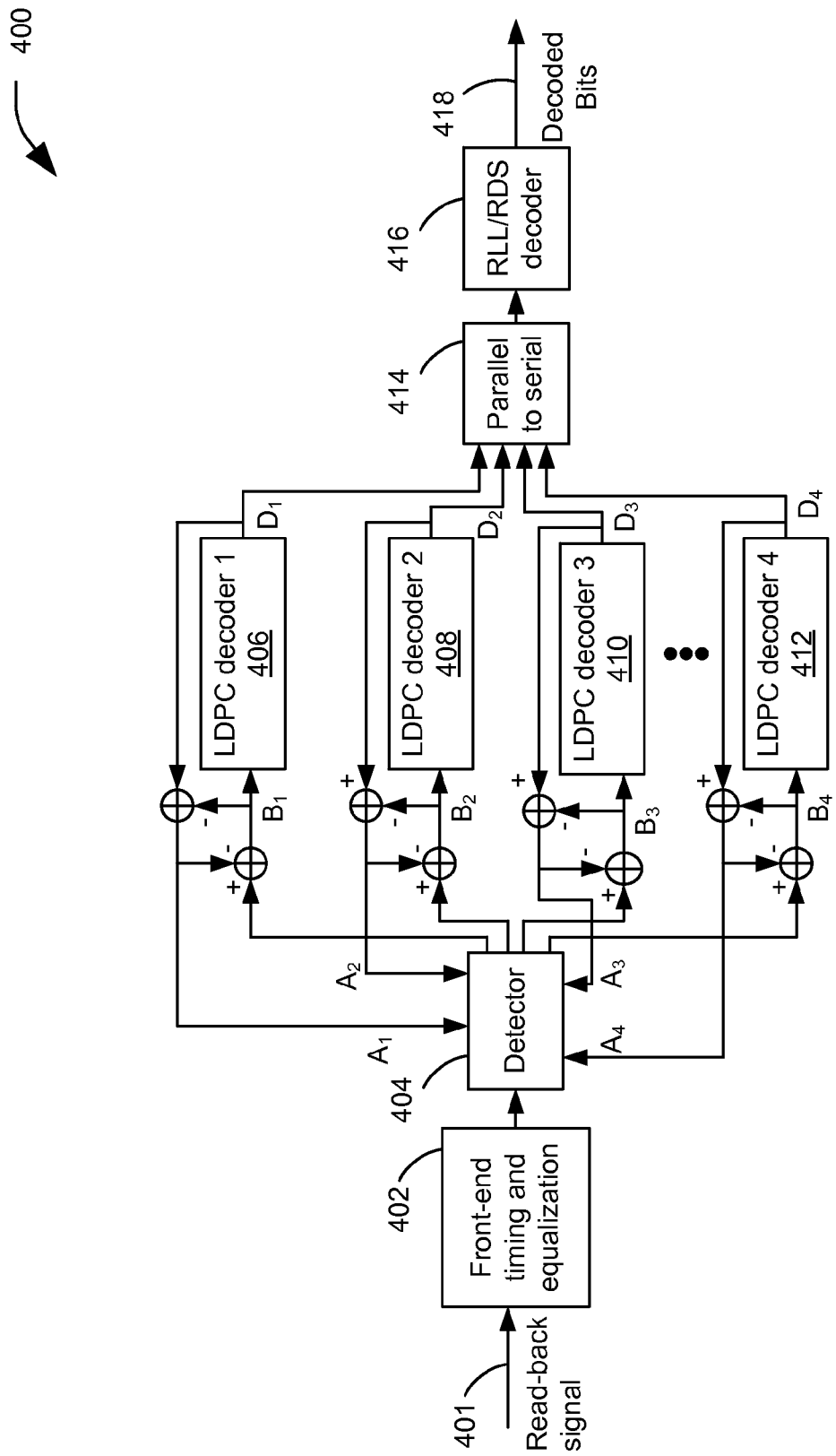
FIG. 4 is a diagram of a decoder, in accordance with certain embodiments of the present disclosure.

Referring to FIG. 4, a diagram of a decoder is shown and generally designated 400. Decoder 400 is an example of a parallel decoding architecture where a soft-decision detector 404, such as a soft-output Viterbi algorithm (SOVA), processes the signal(s) obtained from the front-end timing and equalization circuits 402 and generates soft-reliability information for the bits of the read-back signal 401. Every bit should belong to one of the codewords from the different ECCs used in the system to encode the bits. The soft information for the bits from one codeword can be sent to a decoder designed for the ECC encoder which produced the respective codeword. When the ECC is an LDPC code, the LDPC decoder for the nth ECC can generate aposteriori soft information (LLR) for the bits from the nth codeword.

Extrinsic information can be generated by subtracting the input apriori LLR information (sent to the decoders 406-412) from the aposteriori LLR information obtained from the decoders 406-412. This extrinsic information is sent back as new apriori information $A_n$ to the detector 404. All the LDPC decoders 406-412 can work in parallel and feedback information to the detector 404 after every t (t can be 1 or more than 1) local iterations. The detector 404 can regenerate aposteriori LLR information for the bits in each codeword and can send new extrinsic information $B_n$ by subtracting the previously obtained apriori LLR information obtained from the LDPC decoders 406-412. Thus, providing global iterative exchange (or, global iterations) between the detector 404 and the LDPC decoders 406-412.

When there are LDPC codes with different error-correcting strengths in a system, the stronger LDPC codes can converge faster and provide useful information back to the detector 404, which help improve the estimates of the bits from the detector 404 to the weaker LDPC codes and help them converge. Once the outputs of the decoders 406-412 have converged or a pre-determined numbered of iterations have occurred, the outputs are provided to the parallel-to-serial converter 414 and the serial output can then be decoded by the RLL/RDS decoder 416 to generate the decoded bits 418, which may then be provided to a processor or host.

By optimizing the choice of the different LDPC codes and by designing the permuter to interleave the bits properly, the system performance and reliability can be improved. This optimization can be done either by a trial-and-error search among a range of LDPC code rates and LDPC codes, or can be done more concretely using information theoretic rules or using set-partitioning rules. When code rates are selected according to information-theoretic rules, the choice of code-rates for the individual ECC codes can depend on the permuter and precoder. However, the overall information rate of a system, such as shown in FIG. 2, is independent of the permuter or the precoder.

Further, the architecture described with respect to FIG. 4 allows less local and global iterations to be performed for on-the-fly (OTF) operation, while more local or global iterations can be performed during error-recovery (ER) operation.

Figure 5A:
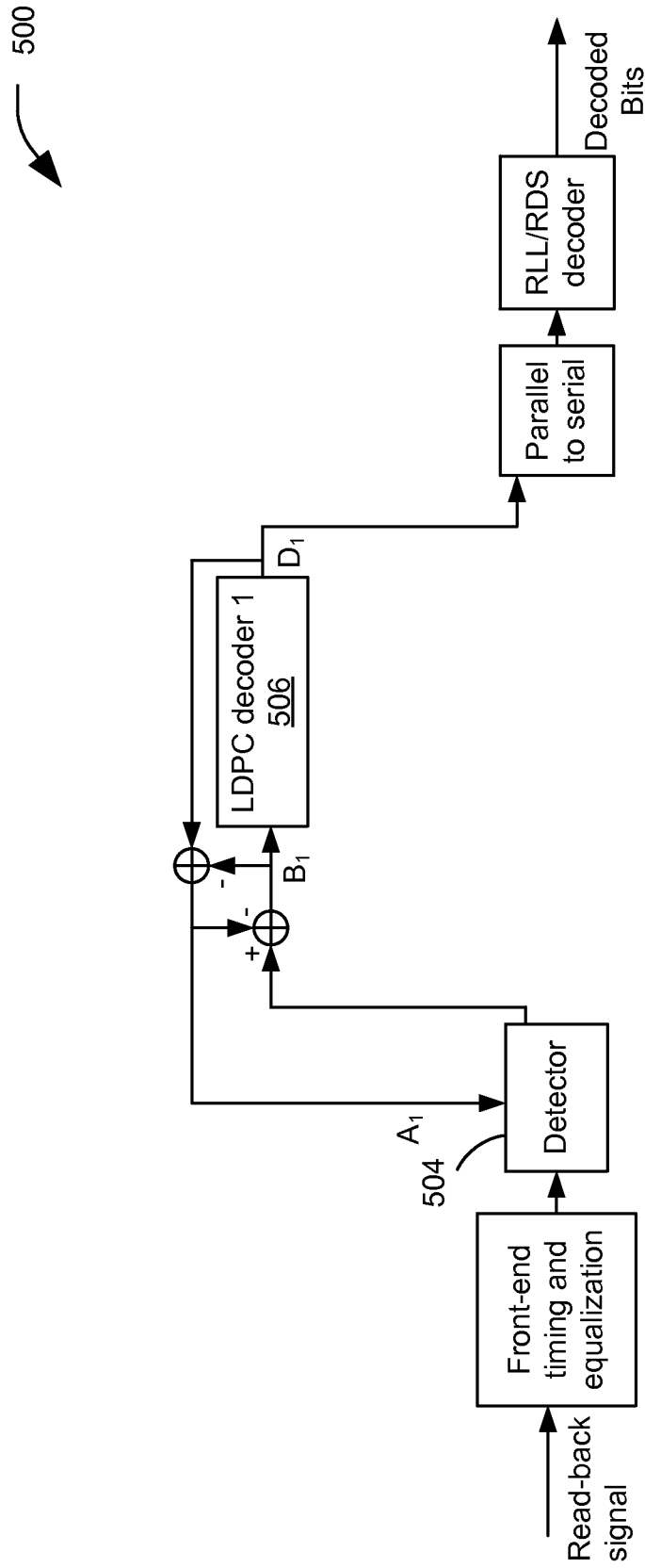
FIGS. 5a-5c are diagrams of various stages of a serial decoder, in accordance with certain embodiments of the present disclosure.
Figure 5B:
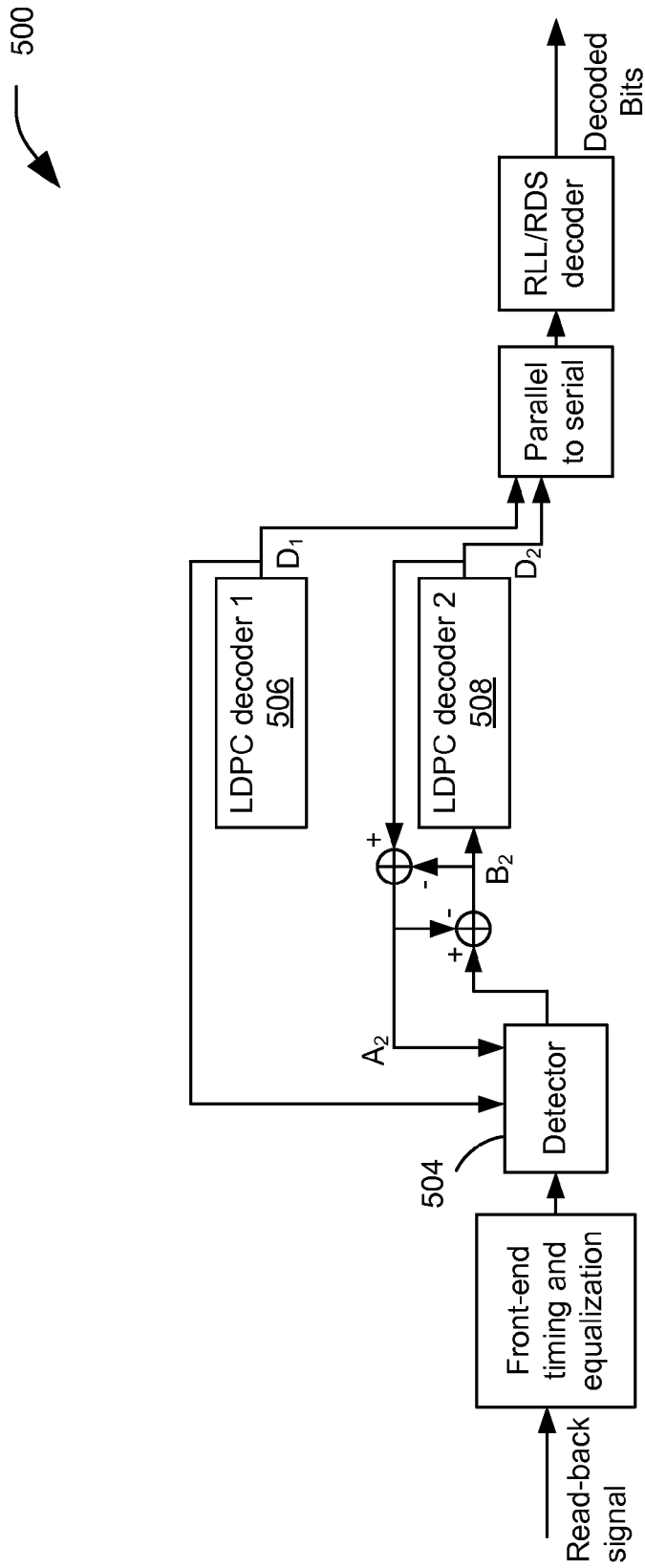
Figure 5C:
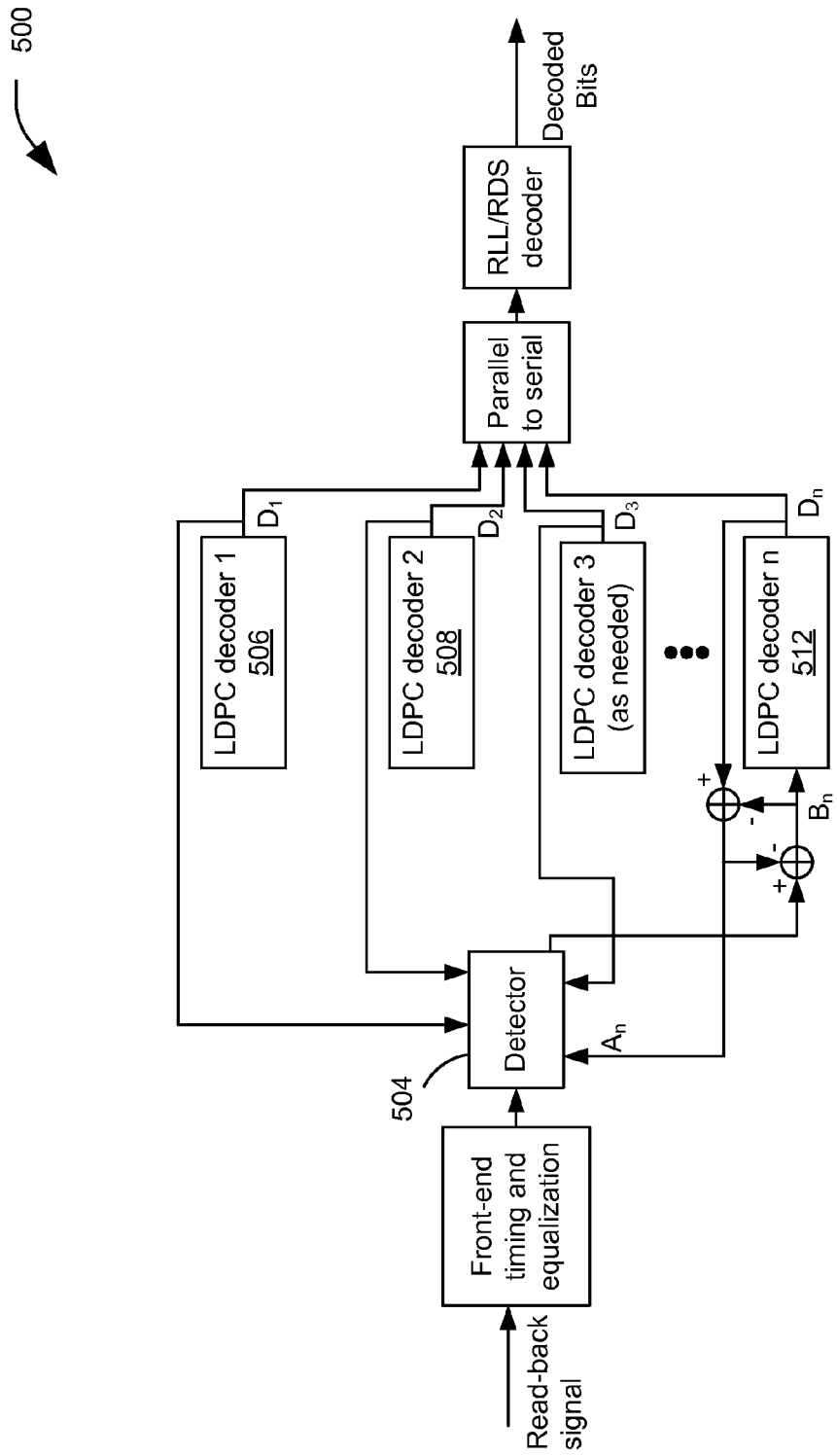

Referring to FIGS. 5a, 5b, and 5c, diagrams of a decoder architecture is shown and generally designated 500. The decoder 500 includes an example serial or sequential decoder architecture. In this example, the LDPC decoders 506, 508, 510, and 512 can work in sequence. In FIG. 5a, the first LDPC decoder can work iteratively with the soft-decision detector 504 until the decoder 506 converges to a codeword or a maximum number of iterations has been reached. Once the decoder 506 converges, the converged decoded bit "D1" can be sent back to the detector 504 and these bits are stored in memory (not shown) for the detector for a next decoding stage. The memory can be within detector 504 or may external but accessible to detector 504.

In FIG. 5b, a next stage of the example serial decoder architecture is shown where LDPC decoder 508 can decode a second codeword. The soft-information estimates of the bits from the detector 504 to the decoder 508 will be better due to the feedback, the decoded bit "D1", from the decoder 506. More or less stages may be implemented based on the architecture of the channel.

In FIG. 5c, a last stage of the example serial decoder architecture is shown where LDPC decoder 512 can decode an nth (last) codeword. The detector 504 can also fix decoded bits from the previous decoding stages. Also, the decoder hardware for each stage can be re-used bringing down the cost/area of placing the decoder circuits(s) on a chip.

The choice of the LDPC codes to be used can be determined using a trial-and-error simulation, be randomly generated, or by using other information theoretic rules. Many variations of LDPC codes will work with the present architecture.

Figure 6A:
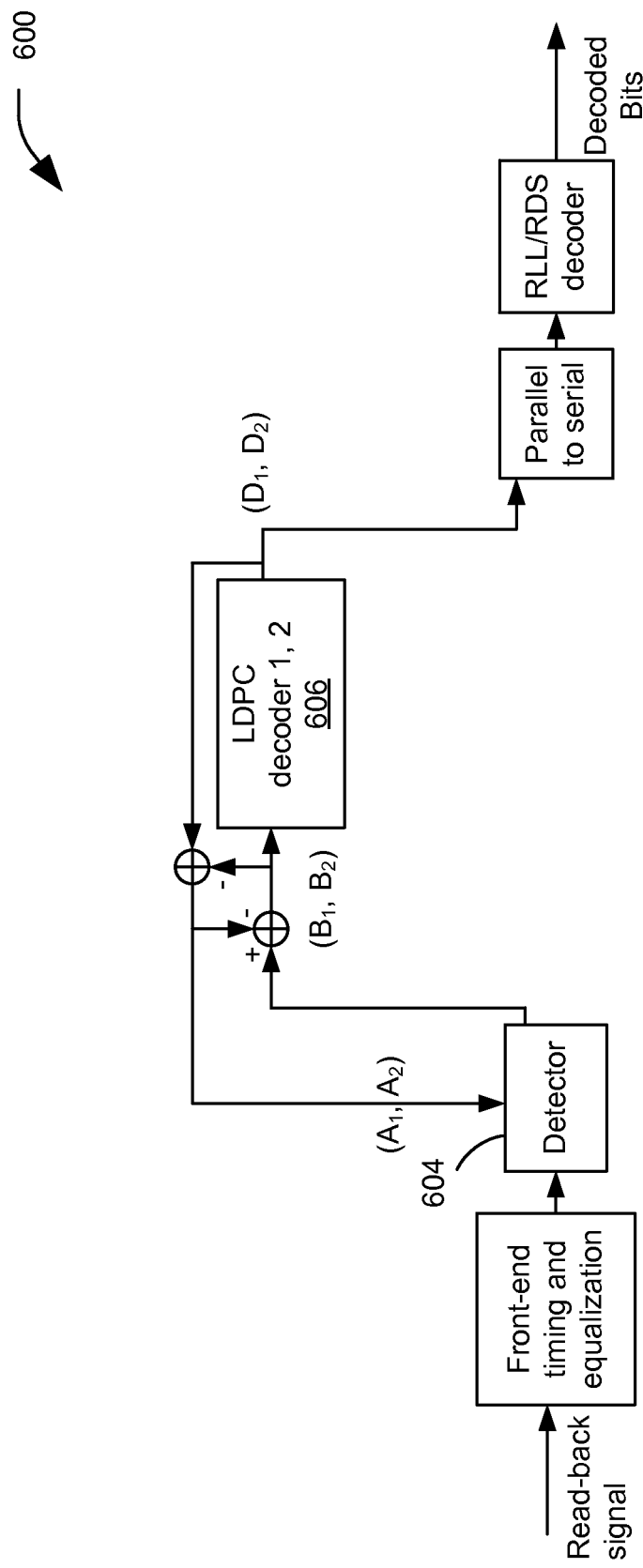
FIGS. 6a-6c are diagrams of various stages of a parallel-serial decoder, in accordance with certain embodiments of the present disclosure.
Figure 6B:
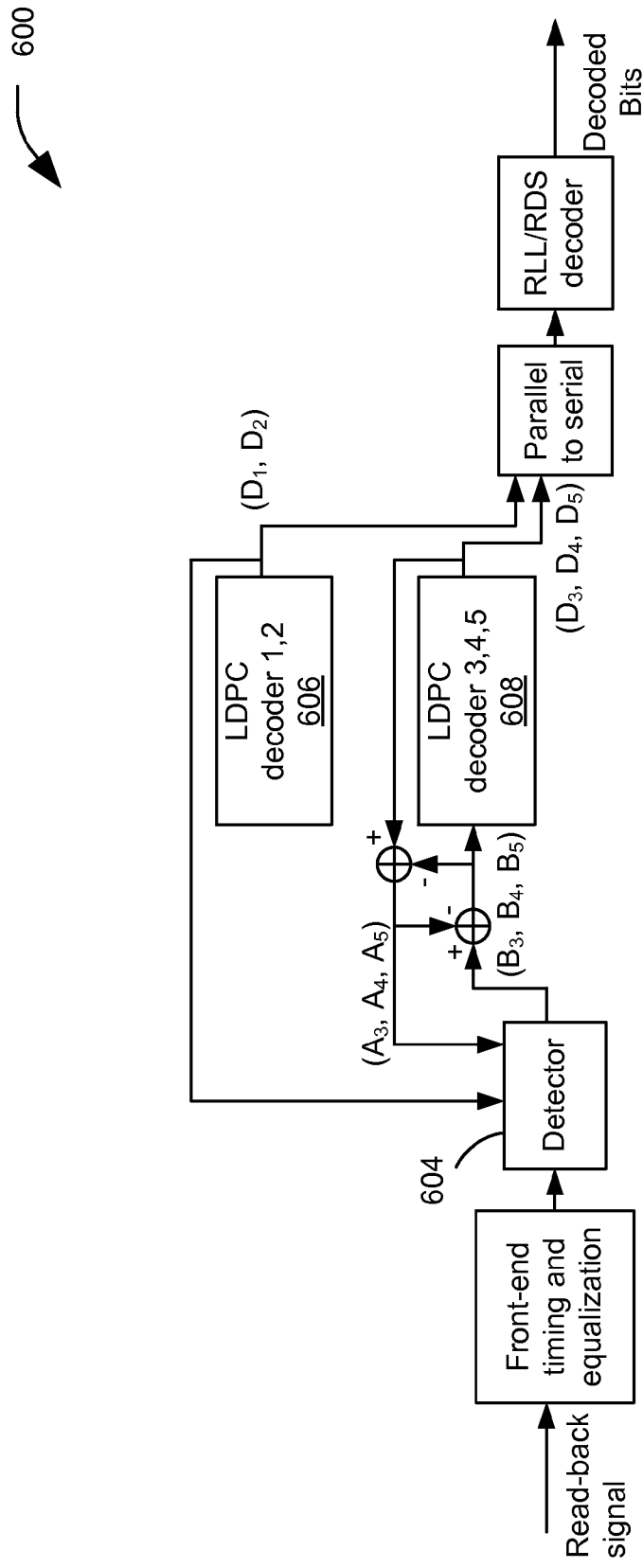
Figure 6C:
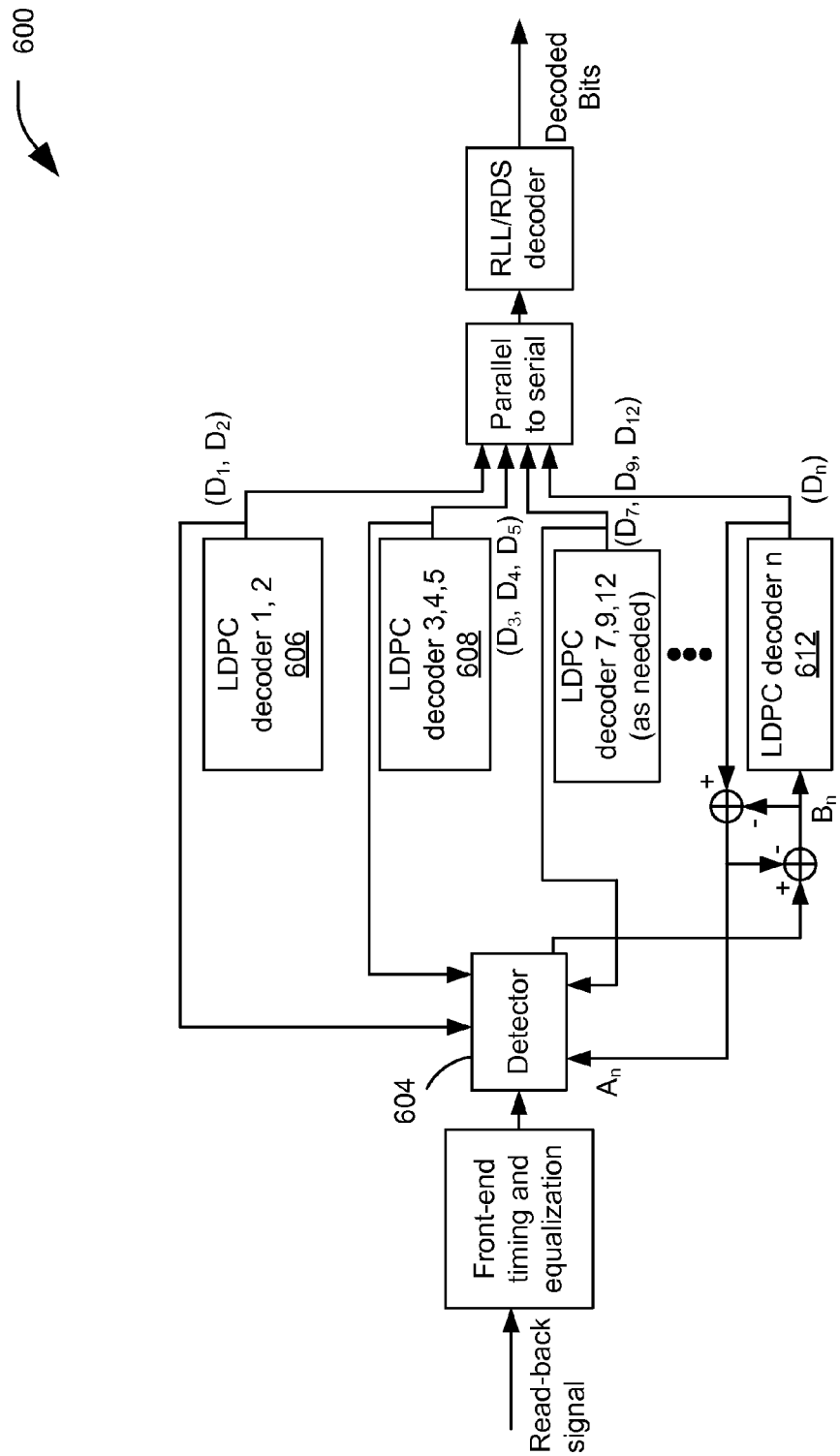

Referring to FIGS. 6a, 6b, and 6c, diagrams of a decoder architecture is shown and generally designated 600. The decoder 600 includes an example combination of parallel and serial decoding architecture. In this architecture, the different ECC decoders can be grouped into different subsets. All the decoders within a subset can operate in parallel, and a serial scheduling can be implemented to process one subset after the next.

For example in FIG. 6a, decoders 1 and 2 (via LDPC decoder 606) can operate in parallel and exchange information with detector 604. After decoders 1 and 2 converge, the decoded bits for the 1st and 2nd codeword $D_1$ and $D_2$ can be stored in memory accessible to the detector 604 during the second stage. As shown in FIG. 6b, the second stage of decoding can occur and decoders 3, 4, and 5 can operate in parallel (via LDPC decoder 608). After decoders 3, 4, and 5 converge, the decoded bits for the $3^{rd}$, $4^{th}$ and $5^{th}$ codeword $D_3$, $D_4$ and $D_5$ can be stored in memory accessible to the detector 604 during the next stage. This can repeat until all codewords have been decoded or a limit has been reached, such as a time limit or iteration limit. As shown in FIG. 6c, the final stage decoder n (via LDPC decoder 612) can work on estimating the bits of the last codeword while the decoded bits from the previous decoding stages are stored in memory for the detector 604.

As with the other examples, decoder hardware can be re-used for each stage of the decoding process shown in FIGS. 6a, 6b, and 6c. Also, any combination of the decoders can be scheduled. The combination and decoding schedules can be optimized to improve performance. For example, information theoretic rules may also be used to select the code rates for the different LDPC codes.

A more general set partitioning rule can be obtained by partitioning the signal constellation according to a combination of codewords, similar to the method of combining codewords using information-theoretic rules.

Figure 7A:
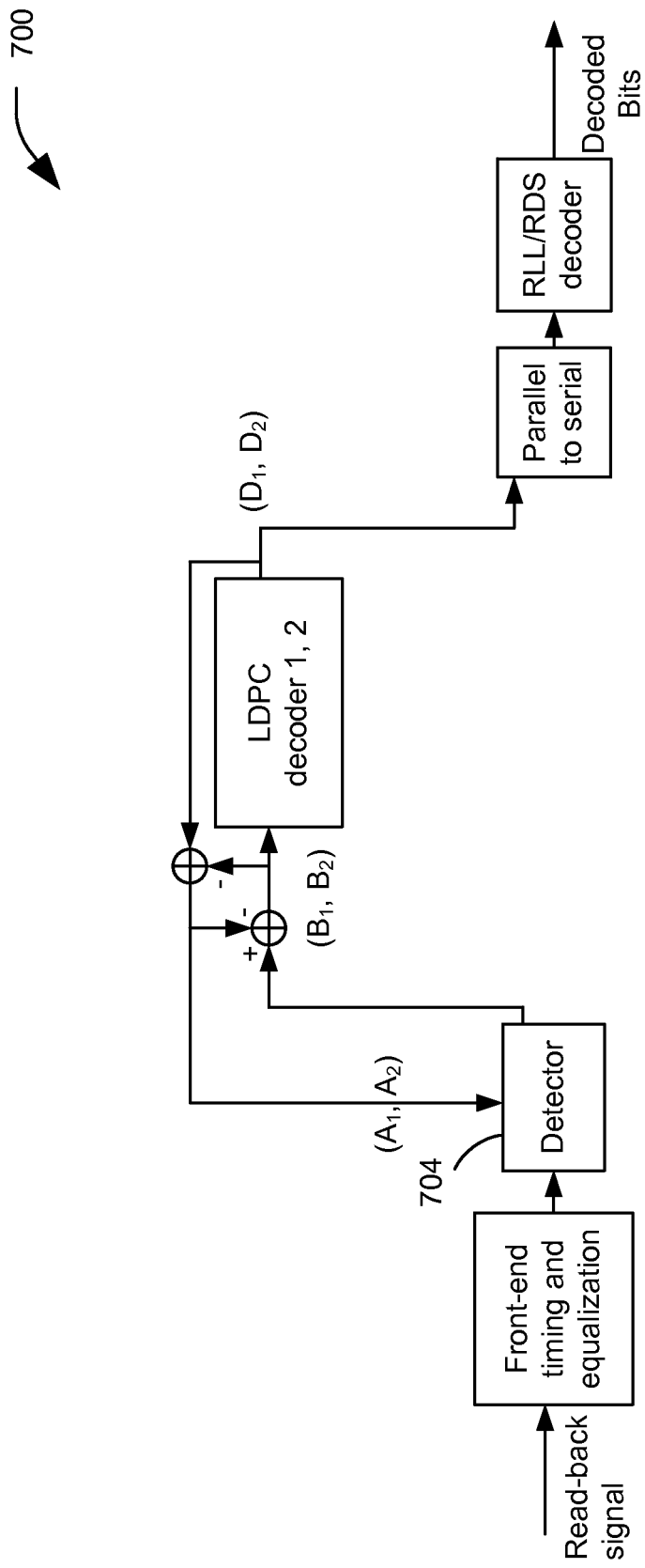
FIGS. 7a-7c are diagrams of various stages of another parallel-serial decoder, in accordance with certain embodiments of the present disclosure.
Figure 7B:
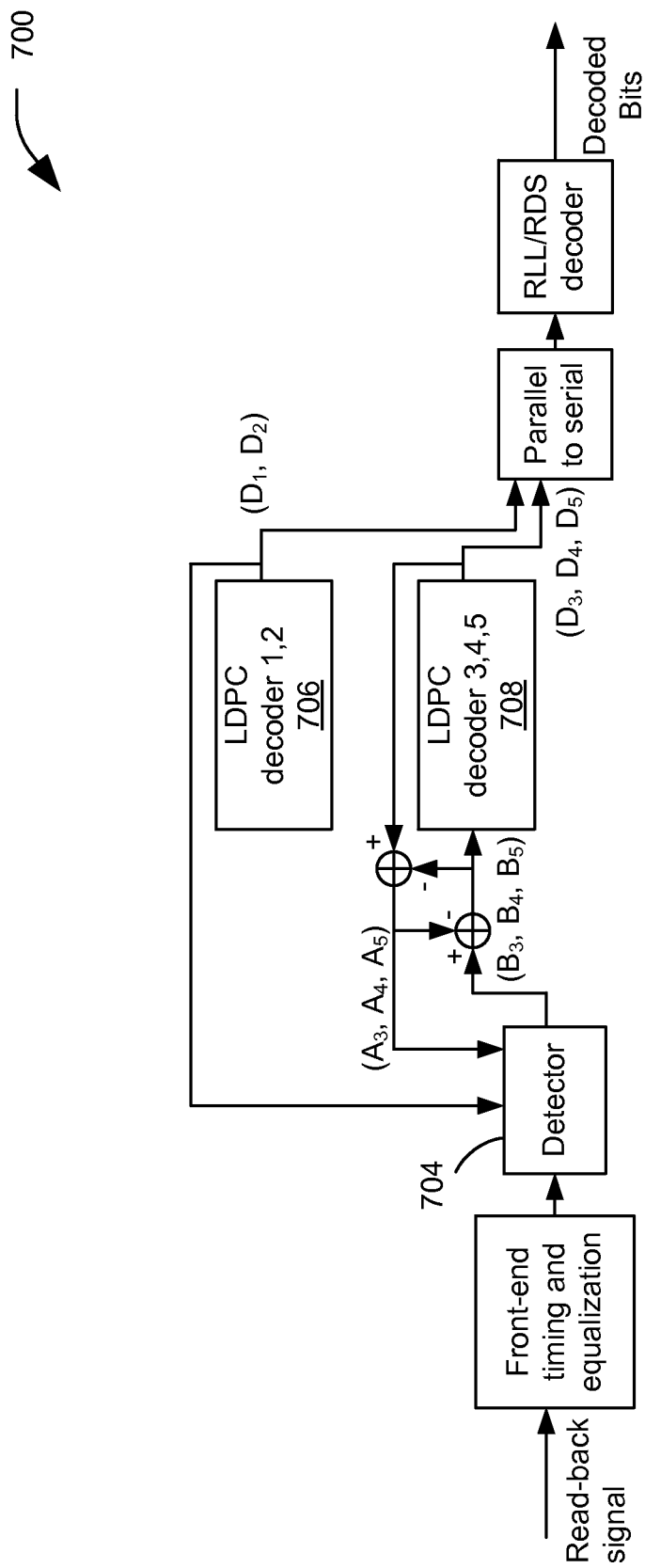
Figure 7C:
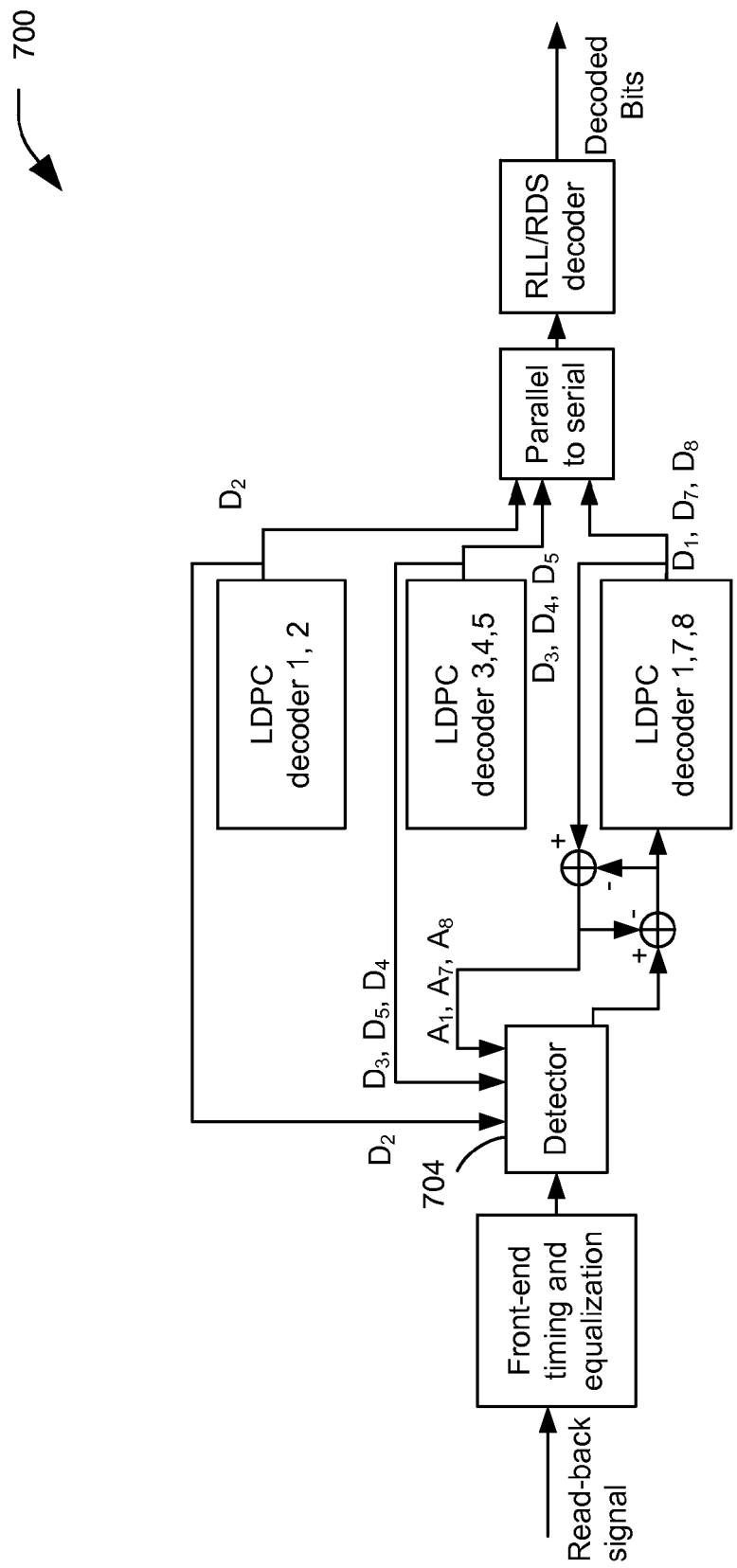

Referring to FIGS. 7a, 7b, and 7c, diagrams of a decoder architecture is shown and generally designated 700. The decoder 700 includes an example combination of parallel and serial decoding architecture. However, decoder 700 differs from decoder 600 in that, for each stage, decoder 700 does not necessarily wait until the ECC decoders that are activated during that stage to converge. Decoder 700 may run a set of ECC decoders in parallel at a given stage for some number of iterations and help improve the apriori information at the detector 704.

Thus, as shown in FIG. 7a, decoder 700 can run decoders 1 and 2 in parallel. If decoder 2 converges, but decoder 1 is yet to converge, decoder 700 may still choose to go ahead and start working on other ECC decoders. Then, as shown in FIG. 7b, decoders 3, 4, and 5 can be activated and the estimated bits from decoder 2 (denoted by $D_2$) can be stored for the detector 704. However, since decoder 1 did not converge at the end of stage 1, the decoder 700 can use the latest apriori information $A_1$ instead of the estimated bits $D_1$ as input to the detector from decoder 1 during stage 2.

In the example, since decoder 1 is yet to converge, the decoder 700 may activate it once again during a later stage, as shown in FIG. 7c. Thus, several different decoder schedules may be designed and one can optimize the scheduling based on system performance.

Also, depending on how much data storage memory there is in a system to store the "states" of activated ECC decoders, a system may be able to restart an ECC decoder at a later stage from the point where it had stopped (since it knows the state of the decoder) and not lose any performance from this ECC decoder. Thus, power, performance, and other system metrics can be optimized based on the available storage memory in the system.

The systems disclosed herein with interleaving among codewords are techniques of transforming a channel with memory (and, in some instances, inter-symbol-interference (ISI)) to a series of memoryless channels when there are a sufficient number of encoders and decoders and when the permuter interleaves the codewords from each ECC encoder. Techniques for designing codes for memoryless channels may be used in this context to improve system performance.

This disclosure describes systems with multiple ECC encoders and multiple ECC decoders over a channel with memory, where at least two of the ECC are different, a general interleaver/permuter to interleave the multiple ECC codewords before transmitting/writing data over the channel, and the decoder iterating back and forth between a channel detector (that mitigates the memory) and the multiple ECC decoders. (Such as in FIGS. 2 and 3).

The ECC encoders and decoders can represent binary ECC or non-binary ECC, or any combination thereof. Each ECC can be a low-density parity-check (LDPC) code, BCH, RS, turbo code, or any other code. Any combination of ECC codes may be used.

This disclosure also describes a permuter/interleaver that maps bits from the output of each ECC encoder and interleaves them in any random, systematic, or non-interleaved (i.e., concatenates the outputs of each encoder one after the other) order. The permuter/interleaver is general enough to interleave at the bit level, at a byte level, etc.

When the ECC codes belong to the same family of codes, common hardware can be used for the ECC encoders, that is the same hardware or circuits may be reused for various instances of decoding, and common hardware can be used for the ECC decoders.

Any kind of precoder such as 1/(1+D), generalized precoder, or a trivial precoder may be used in addition to the interleaver/permuter.

The channel with memory may be an inter-symbol-interference (ISI) channel, such as in a hard disc drive.

Further, the systems disclosed herein can include a parallel decoder schedule where all ECC decoders operate in parallel and feedback information to a detector and do this iteratively. Information from each decoder can be used in subsequent global iteration(s) in the detector to improve estimates for the other decoders. (Such as in FIG. 4).

Each ECC decoder maybe a soft-decision decoder (e.g., LDPC decoder) or a hard-decision decoder (e.g., BCH decoder for BCH codes). The detector maybe a soft-decision detector (e.g., SOVA) or a hard decision detector (e.g., Viterbi).

Even further, the systems disclosed herein can include a serial decoder schedule, where the decoders can be activated sequentially. The first decoder can exchange information with the detector iteratively until convergence. Then, the second decoder can work iteratively with the detector with the decoded bits from the first decoder stored for detector, etc. (Such as in FIGS. 5a, 5b, 5c).

Still even further, the systems disclosed herein can include a combination of parallel and serial decoding schedules. (Such as in FIGS. 6a, 6b, and 6c).

In another variation, a more general version of the decoding architecture shown in FIGS. 6a, 6b, and 6c, can be implemented, where even if some of the LDPC decoders in an earlier stage have not converged, the decoder can move to the next stage and schedule those non-converged LDPC decoders in a future stage of the serial-parallel architecture. (For example see FIGS. 7a, 7b, and 7c).

The hardware can store the state of m ECC decoders at one time, where 1<m<n. For example, if the ECC decoder is an LDPC decoder, the state information could be the messages on the edges of an LDPC graph or the state of the check nodes or the variable nodes at any given time. This way, if a decoder was implemented for the decoding schedule shown in FIGS. 7a, 7b, and 7c, the system can restart a decoder at a later stage in the decoding schedule from the point/state where it had been stopped in an earlier stage if the state of the decoder were stored in hardware or memory.

The disclosed multiple ECC architecture can support having a sequential detector architecture, where there is a separate detector hardware for each global iteration. The disclosed multiple ECC architecture can also support having a joint detector schedule where there is only one detector for every global iteration.

Figure 8:
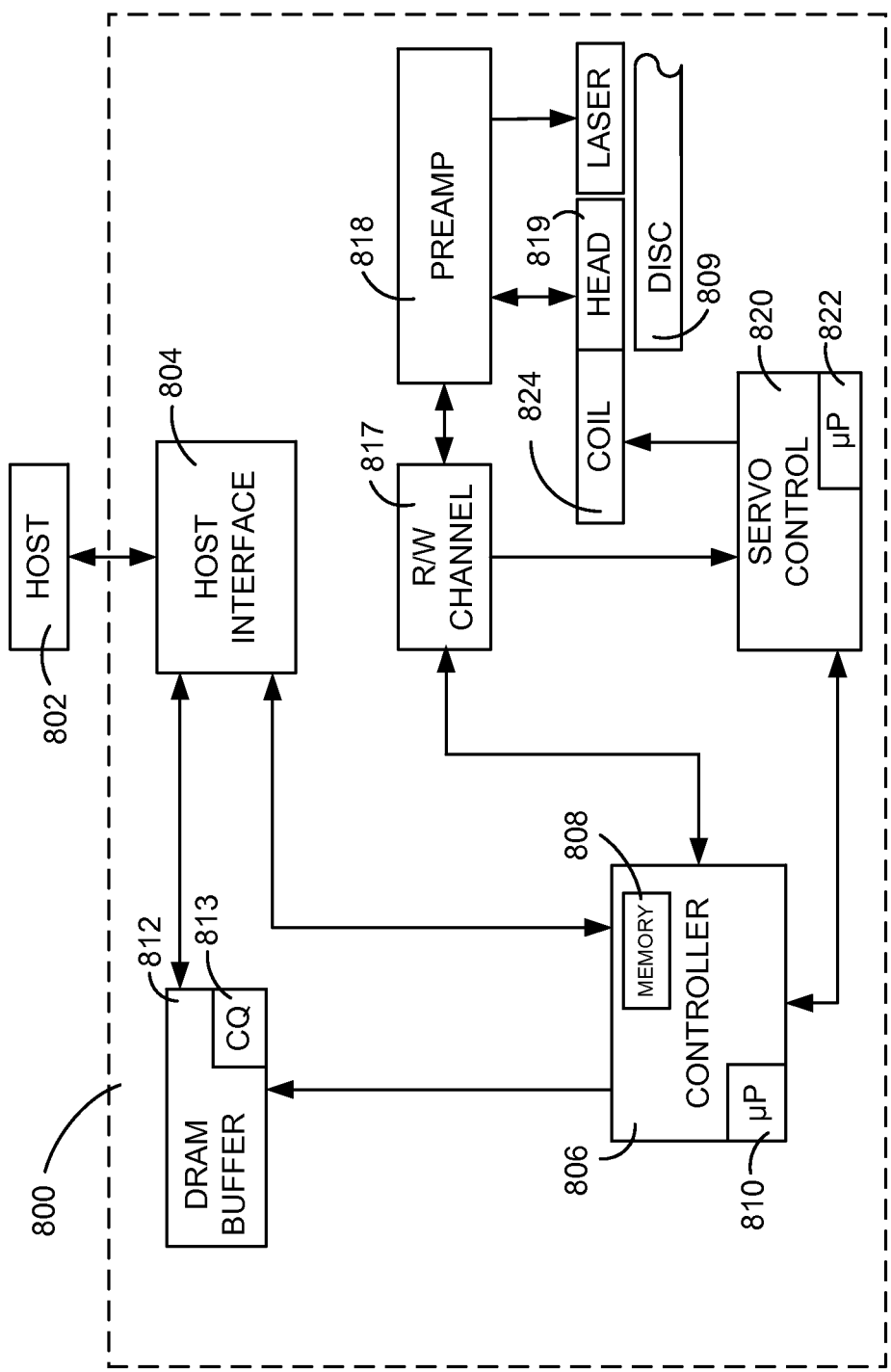
FIG. 8 is a diagram of a data storage device with a digital communications channel, in accordance with certain embodiments of the present disclosure.

FIG. 8 depicts a diagram of a data storage device with a digital communications channel, generally designated 800. Specifically, FIG. 8 provides a functional block diagram of a data storage device (DSD) and in particular, a hard disc drive. The DSD 800 can optionally connect to be removable from a host device 802, which can be a desktop computer, a laptop computer, a server, a telephone, a music player, another electronic device, or any combination thereof. The data storage device 800 can communicate with the host device 802 via the hardware/firmware based host interface circuit 804 that may include a connector that allows the DSD 800 to be physically removed from the host 802.

The DSD 800 can include a programmable controller 806 with associated memory 808 and processor 810. A buffer 812 can temporarily store user data during read and write operations and can include a command queue (CQ) 813 where multiple access operations can be temporarily stored pending execution. Further, FIG. 8 shows the DSD 800 can include a read/write (R/W) channel 817, which can encode data during write operations and reconstruct user data during read operations. A preamplifier/driver circuit (preamp) 818 can apply write currents to the head(s) 819 and can provide pre-amplification of readback signals. A servo control circuit 820 may use servo data to provide the appropriate current to the coil 824 to position the head(s) 819 over disc(s) 809. The controller 806 can communicate with a processor 822 to move the head(s) 819 to the desired locations on the disc(s) 809 during execution of various pending commands in the command queue 813 or during other operations. The channel configurations and systems described herein may be implemented in the R/W channel 817 as hardware circuits, software, memory, or any combination thereof.

In the above detailed description of the embodiments, reference is made to the accompanying drawings which form a part hereof, and in which are shown by way of illustration of specific embodiments. It is to be understood that features of the various described embodiments may be combined, other embodiments may be utilized, and structural changes may be made without departing from the scope of the present disclosure.

In accordance with various embodiments, the methods and systems described herein may be implemented as one or more software programs running on a computer processor or controller device. In accordance with other embodiments, the methods and software described herein may be implemented as one or more software programs running on a computing device, such as a personal computer that is using a data storage device such as a disc drive. Dedicated hardware implementations including, but not limited to, application specific integrated circuits, programmable logic arrays, and other hardware devices can likewise be constructed to implement the methods and systems described herein. Further, the methods described herein may be implemented as a computer readable data storage medium or device storing instructions that when executed cause a processor to perform the methods.

The illustrations of certain embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a communications circuit including:
        a detector configured to estimate bits of a signal received from a channel; and
        a decoding circuit including a first error-correcting code (ECC) decoder with a first code strength and a second ECC decoder with a second code strength, the first code strength different than the second code strength and the first ECC decoder can provide information to the detector to improve an estimate of bits the detector is to provide to the second ECC decoder.

2. The apparatus of claim 1 further comprising:
    the first ECC decoder and the second ECC decoder configured in a sequential detector architecture to perform at least one iterative exchange of information between first ECC decoder, the second ECC decoder, and the detector.

3. The apparatus of claim 1 further comprising:
    the first ECC decoder and the second ECC decoder configured in a parallel-serial architecture and for each stage of decoding, the decoding circuit does not wait until all ECC decoders that are activated during a stage to converge before activating other stages of decoding.

4. The apparatus of claim 1 further comprising:
the detector configured to produce first reliability estimates for the bits;
the decoding circuit configured to receive the first reliability estimates and process the first reliability estimates for one or more iterations to produce information that is provided back to the detector; and
the detector further configured to receive the information and produce second estimates for the bits of the signal and determine second reliability estimates for the bits.

5. The apparatus of claim 4 further comprising:
the communications circuit configured to iteratively repeat estimating the bits at the detector and processing reliability estimates at the decoding circuit until the decoding circuit converges to a codeword.

6. The apparatus of claim 5 further comprising:
the communications circuit configured to repeat estimating the bits at the detector and process reliability estimates at the decoding circuit until a threshold number of iterations has been reached.

7. The apparatus of claim 1 further comprising:
an encoding circuit including multiple ECC encoders; and
a permuter configured to arrange codewords received from the multiple ECC encoders to produce an output signal to be transmitted over a channel.

8. The apparatus of claim 7 further comprising:
the permuter configured to interleave outputs of the multiple ECC encoders.

9. The apparatus of claim 7 further comprising:
the permuter including an interleaver configured to concatenate outputs of the multiple ECC encoders to produce the output signal.

10. The apparatus of claim 7 further comprising the channel is a magnetic recording channel.

11. An apparatus comprising:
a digital communications receiver including:
    a detector configured to estimate bits of a signal received from a channel; and
    a decoding circuit including more than one error correcting code (ECC) decoder, the decoding circuit configured to provide information from the decoding circuit to the detector, the ECC decoders configured to process the signal by iterating between the detector and the decoding circuit to decode received codewords; and
    the more than one ECC decoders include a first ECC decoder and a second ECC decoder both of which are low density parity check (LDPC) code decoders, the first ECC decoder has a first LDPC code strength that has a different error-correcting strength than a second LDPC code strength of the second ECC decoder, and the first LDPC code strength is a stronger LDPC code than the second LDPC code strength; and
    the first ECC decoder is configured to implement the stronger LDPC code to converge faster than the second ECC decoder and the first ECC decoder can provide information to the detector to improve an estimate of bits from the detector associated with second ECC decoder.

12. The apparatus of claim 11 further comprising:
the first ECC decoder and the second ECC decoder can, for a selected ECC, generate soft information for corresponding bits from a corresponding codeword;
each of the first ECC decoder and the second ECC decoder are configured to:
    determine extrinsic information by subtracting the soft information obtained at a respective decoder from an estimated bit for the respective decoder; and
    provide the extrinsic information to the detector.

13. The apparatus of claim 12 further comprising:
each of the LDPC decoders are configured to operate in parallel and feedback information to the detector after one or more iterations; and
the detector is configured to regenerate information for the estimated bits in each codeword and send new information to the LDPC decoders.

14. The apparatus of claim 11 further comprising:
a third ECC decoder of the ECC decoders configured to decode at least one data bit upon completion of the first ECC decoder and the second ECC decoder.

15. The apparatus of claim 14 further comprising:
the decoder circuit is configured to:
    initiate decoding via the third ECC decoder when at least one bit from the first ECC decoder or the second ECC decoder has not converged; and
    schedule non-converged ECC decoders for a future stage of the decoder circuit.

16. The apparatus of claim 11 further comprising:
a memory configured to store a state of at least one of the ECC decoders; and
the decoder circuit configured to restart a selected decoder of the ECC decoders at a later stage in a decoding schedule and to store a previous state of the selected decoder in the memory.

17. A system comprising:
a digital signal decoding circuit including:
    a first decoder with a first code strength to estimate a first bit of a digital signal;
    a second decoder with a second code strength weaker than the first code strength;
    the first decoder configured to produce an estimate of a first bit and information to improve an estimate of a second bit of the digital signal;
    the second decoder configured to produce an estimate of the second bit of the digital signal based on the information; and
    a parallel-to-serial converter configured to produce a serial output based on the estimate of the first bit and the estimate of the second bit.

18. The system of claim 17 wherein:
the digital signal decoding circuit configured to perform a combination of parallel decoding and serial decoding where a first set of decoders is configured to operate in parallel and, after the first set of decoders operates, a second set of decoders is configured to operate in serial; and
at least two decoders of the second set of decoders each provide an estimate of a bit to the parallel-to-serial converter.

19. The system of claim 18 wherein:
the first set of decoders and the second set of decoders include a same decoding circuit where
the first set of decoders are configured to provide the estimate of the first bit to the parallel-to-serial converter; and
the second set of decoders are configured to provide the estimate of the second bit to the parallel-to-serial converter.

* * * * *